(12) United States Patent
Bailey et al.

(10) Patent No.: US 10,772,241 B2
(45) Date of Patent: Sep. 8, 2020

(54) CLOSED-LOOP SUPPLEMENTAL HEATER SYSTEM IN AN AIR HANDLER SYSTEM OF OUTSIDE AIR COOLED DATA CENTER

(71) Applicant: DELL PRODUCTS, L.P., Round Rock, TX (US)

(72) Inventors: Mark M. Bailey, Round Rock, TX (US); Tyler B. Duncan, Austin, TX (US); Trey S. Wiederhold, Cedar Park, TX (US); Michael M. Toulouse, San Jose, CA (US)

(73) Assignee: Dell Products, L.P., Round Rock, TX (US)

( * ) Notice: Subject to any disclaimer, the term of this patent is extended or adjusted under 35 U.S.C. 154(b) by 117 days.

(21) Appl. No.: 15/960,399

(22) Filed: Apr. 23, 2018

(65) Prior Publication Data
US 2019/0327862 A1 Oct. 24, 2019

(51) Int. Cl.
*H05K 7/20* (2006.01)
*H05K 7/14* (2006.01)

(52) U.S. Cl.
CPC ....... *H05K 7/20836* (2013.01); *H05K 7/1497* (2013.01); *H05K 7/20745* (2013.01); *H05K 7/20827* (2013.01)

(58) Field of Classification Search
CPC ............. H05K 7/20836; H05K 7/1497; H05K 7/20745; H05K 7/20827
See application file for complete search history.

(56) References Cited

U.S. PATENT DOCUMENTS

| 4,813,475 A * | 3/1989 | Couvrette .......... G05D 23/1919 109/2 |
| 5,367,601 A | 11/1994 | Hannabery |
| 6,926,078 B2 | 8/2005 | Beitelmal et al. |
| 9,155,229 B2 | 10/2015 | Schmitt et al. |
| 9,392,733 B2 | 7/2016 | Day |
| 9,461,456 B2 | 10/2016 | Bailey |
| 9,814,160 B2 | 11/2017 | Slessman et al. |
| 10,440,863 B1 * | 10/2019 | Shelnutt ............... H05K 7/1497 |
| 2001/0000880 A1 | 5/2001 | Chu et al. |
| 2003/0010490 A1 * | 1/2003 | Reeck ................. H05K 7/20572 165/222 |
| 2012/0006507 A1 | 1/2012 | Su et al. |

(Continued)

*Primary Examiner* — Nelson J Nieves
(74) *Attorney, Agent, or Firm* — Isidore PLLC

(57) ABSTRACT

Cooling system of modular data center (MDC) has air handling unit (AHU) that circulates cooling air through information technology (IT) module(s). Transducer(s) sense first air characteristic value of cooling air directed to IT module(s) of MDC, the value being selected one of: (i) temperature value; and (ii) humidity value. AHU controller determines whether first air characteristic value satisfies first air characteristic criterion of one of: (i) a temperature value equal to or greater than minimum temperature threshold; and (ii) a humidity value equal to or less than maximum humidity threshold. In response to determining that first air characteristic criterion is not satisfied, AHU controller triggers supplemental heater to warm cooling air before cooling air comes into contact with IT module(s) inside of MDC to at least one of: (i) provide cooling air above minimum operating temperature of components within IT module(s); and (ii) prevent condensation.

17 Claims, 6 Drawing Sheets

(56) References Cited

U.S. PATENT DOCUMENTS

| | | | |
|---|---|---|---|
| 2012/0014061 A1* | 1/2012 | Slessman | H05K 7/20836 361/691 |
| 2012/0190292 A1* | 7/2012 | Skrepcinski | F24F 7/007 454/258 |
| 2012/0234527 A1* | 9/2012 | Murayama | G05D 22/02 165/287 |
| 2013/0278120 A1* | 10/2013 | Elkins | H05K 5/0213 312/236 |
| 2014/0190191 A1* | 7/2014 | Slessman | H05K 7/20836 62/91 |
| 2014/0190198 A1* | 7/2014 | Slessman | H05K 7/20745 62/314 |
| 2014/0216681 A1* | 8/2014 | Manninen | H05K 7/206 165/11.1 |
| 2014/0254085 A1 | 9/2014 | Slessman | |
| 2014/0340842 A1* | 11/2014 | Towner | F24F 6/02 361/679.48 |
| 2017/0238444 A1 | 8/2017 | Slessman et al. | |
| 2018/0073764 A1* | 3/2018 | Yoshikawa | F24F 3/044 |
| 2018/0098464 A1* | 4/2018 | Ishinabe | H05K 7/20236 |
| 2018/0124955 A1* | 5/2018 | Rogers | H05K 7/20727 |
| 2018/0270989 A1* | 9/2018 | Chainer | G06F 1/3206 |
| 2019/0179384 A1* | 6/2019 | Sato | F25B 1/00 |
| 2019/0200478 A1* | 6/2019 | Fujimoto | H05K 7/20 |
| 2019/0235449 A1* | 8/2019 | Slessman | F24F 11/00 |

* cited by examiner

CLOSED-LOOP SUPPLEMENTAL HEATER SYSTEM IN AN AIR HANDLER SYSTEM OF OUTSIDE AIR COOLED DATA CENTER

BACKGROUND

1. Technical Field

The present disclosure relates in general to cooling system controls in an information handling system (IHS), and more particularly to control of air handling units (AHUs) that provide cooling air to a particular information technology (IT) module of an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The rack-configured IHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the rack-configured IHS. Traditional heat removal systems include use of air movers, such as fans, to convectionally transfer the heat from inside of the IHS to outside the IHS. Air handling units are provided in large scale data centers. Outside air in some instances can be colder than a minimum threshold for certain information technology (IT) components, which could lead to failure or reduced reliability. Outside air, in other instances, can be too humid, causing condensation that can also damage IT components. When the outside air is too cold or humid, data centers that are cooled using outside air utilize the waste heat recirculated from the servers as IT return air to mix with low temperature and/or high humidity outside air to increase the temperature of the IT supply air and/or to reduce relative humidity.

BRIEF SUMMARY

In accordance with the teachings of the present disclosure, a cooling system for a modular data center (MDC) uses supplemental heat to prevent cooling air from being below a minimum temperature value for components of the MDC and to prevent condensation within the MDC. In one or more embodiments, the cooling system includes an air handling unit (AHU) that circulates cooling air through one or more information technology (IT) modules of the MDC. At least one first air characteristic transducer is positioned to sense a first air characteristic value of cooling air directed to the one or more IT modules of the MDC, the value being a selected one of: (i) a temperature value; and (ii) a humidity value. A supplemental heater is positioned to transfer supplemental heat to the cooling air before the cooling air reaches the one or more IT modules of the MDC. An AHU controller is in communication with the at least one first air characteristic transducer and the supplemental heater. The AHU controller executes an AHU utility to enable the cooling system to determine whether the first air characteristic value satisfies a first air characteristic criterion from among: (i) a temperature value being equal to or greater than a minimum temperature threshold; and (ii) a humidity value being equal to or less than a maximum humidity threshold. The AHU controller executes the AHU utility to enable the cooling system to trigger the supplemental heater to warm the cooling air in response to determining that the first air characteristic criterion is not satisfied.

According to aspects of the present innovation, a MDC includes a cooling system and one or more IT modules installed within the MDC. The cooling system includes an air handling unit (AHU) that circulates cooling air through one or more information technology (IT) modules of the MDC. At least one first air characteristic transducer is positioned to sense a first air characteristic value of cooling air directed to the one or more IT modules of the MDC, the value being a selected one of: (i) a temperature value; and (ii) a humidity value. A supplemental heater is positioned to transfer supplemental heat to the cooling air before the cooling air reaches the one or more IT modules of the MDC. An AHU controller is in communication with the at least one first air characteristic transducer and the supplemental heater. The AHU controller executes an AHU utility to enable the cooling system to determine whether the first air characteristic value satisfies a first air characteristic criterion of one of: (i) a temperature value equal to or greater than a minimum temperature threshold; and (ii) a humidity value equal to or less than a maximum humidity threshold. The AHU controller executes the AHU utility to enable the cooling system to trigger the supplemental heater to warm the cooling air in response to determining that the first air characteristic criterion is not satisfied. The supplemental heater is used (i) to provide cooling air above a minimum operating temperature of components within the one or more IT modules and (ii) to prevent condensation.

According to illustrative embodiments of the present disclosure, a method is provided for regulating air temperature of cooling air in a MDC with supplemental heating. The method includes circulating cooling air through one or more IT modules of a MDC. The method includes sensing a first air characteristic value of cooling air directed to the one or more IT modules of the MDC, the value being a selected one of: (i) a temperature value; and (ii) a humidity value. The method includes determining whether the first air characteristic value satisfies a first air characteristic criterion from among: (i) a temperature value being equal to or greater than a minimum temperature threshold; and (ii) a humidity value being equal to or less than a maximum humidity threshold. In response to determining that the first air characteristic criterion is not satisfied, the method includes triggering a supplemental heater to warm the cooling air to: (i) provide cooling air above a minimum operating temperature of components within the one or more IT modules; and/or (ii) prevent condensation.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
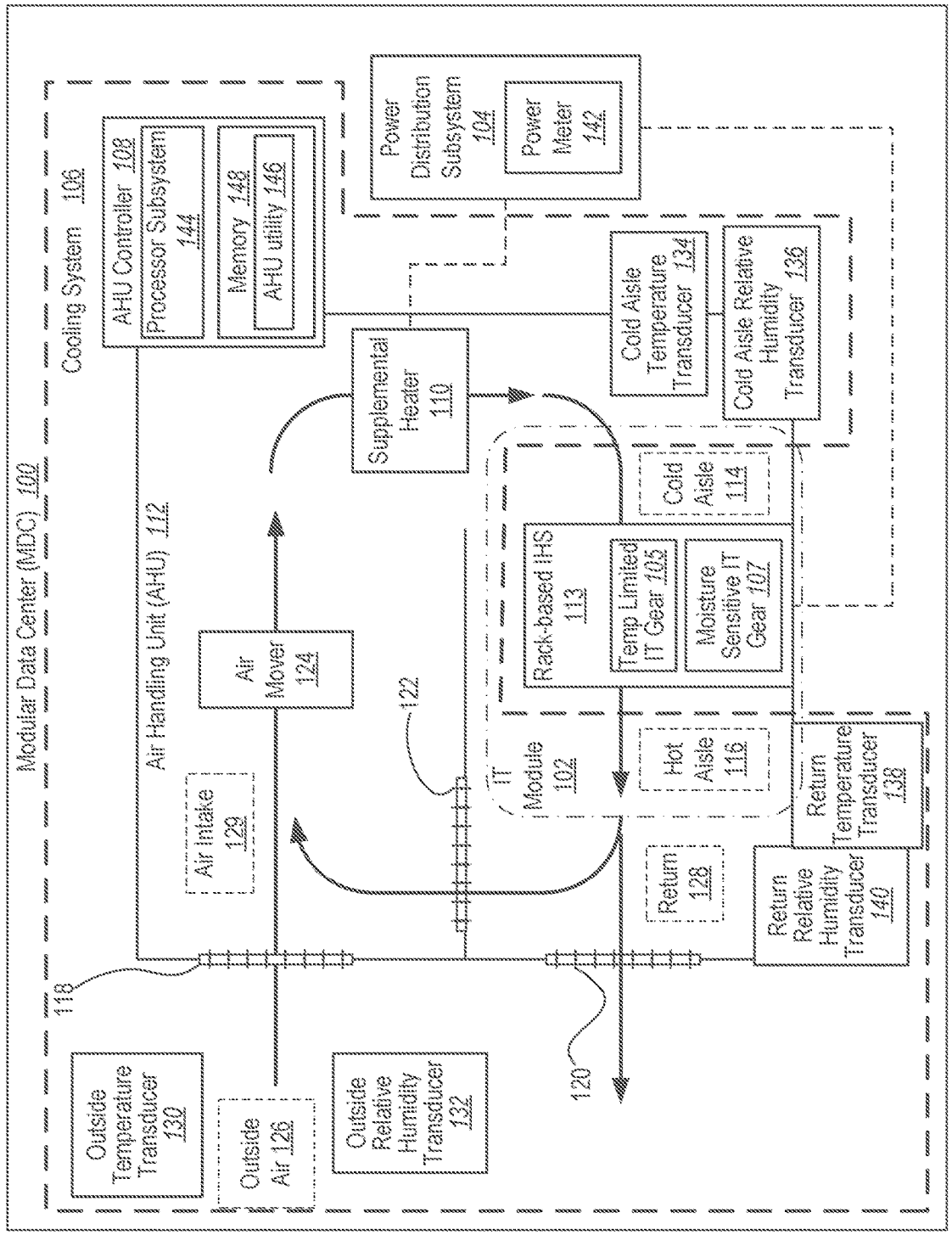
FIG. 1 is a block diagram illustrating an example outside air cooled information handling system (IHS) having a supplemental heating source, according to one or more embodiments.

According to aspects of the present innovation, a cooling system of a modular data center (MDC) uses supplemental heating when required. The cooling system controls an air mover that circulates cooling air through information technology (IT) modules of the MDC. Air moved through the cooling system and IT modules is generally referred to as cooling air. Transducers sense air characteristic(s) of one or both of an air temperature and a humidity value of the cooling air. An AHU controller determines whether the first air characteristic value satisfies a first air characteristic criterion of one of: (i) a temperature value equal to or greater than a minimum temperature threshold; and (ii) a humidity value equal to or less than a maximum humidity threshold. In response to determining that the first air characteristic criterion is not satisfied, the AHU controller triggers a supplemental heater to warm the cooling air before the cooling air comes into contact with the IT module(s) inside of the MDC. Supplemental heating is provided to: (i) bring the temperature of cooling air above a minimum operating temperature of components within the IT module(s); and (ii) prevent condensation in the IT module(s).

Cooling air that is presented to the at least one IT module, such as via a cold aisle of each IT module, is referred to herein as IT supply air. The cooling air that is warmed by the at least one IT module in passing from the cold aisle through or over rack-based information handling systems (IHSs) is referred to herein as IT return air. IT return air is guided within at least one IT module and air handling units (AHUs) of the cooling system. IT return air is exhausted to the outside environment, recirculated within AHUs, or both.

The present disclosure contemplates that outside air in some instances can be colder than a minimum threshold for certain information technology (IT) components, which could lead to failure or reduced reliability. Outside air, in other instances, can be too humid, causing condensation that can also damage IT components. When the outside air is too cold or humid, data centers that are cooled using outside air utilize the waste heat recirculated from the servers as IT return air to mix with low temperature and/or high humidity outside air to increase the temperature of the IT supply air and/or to reduce relative humidity. However, in certain operational conditions, the IHS does not carry a sufficient compute workload to generate the necessary amount of heat as compute waste heat to sufficiently warm the IT supply air.

In one or more embodiments, a cooling system utilizes variable heat load banks controlled by an environmental control system to supplement the compute waste heat. The sufficient amount of supplemental heating can be determined based on temperatures and relative humidity of outside air and recirculated IT return air. Additionally or alternatively, the sufficient amount of supplemental heating can be determined at least in part based on a current amount of power being consumed by the IT modules, as compared to a minimum required power load. The supplemental heater is remotely controlled to mimic the additionally required compute IT load. The amount of supplemental heating is dynamically adjusted to avoid wasting energy as the compute IT load changes.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 is a block diagram illustrating a modular data center (MDC) 100 having an IT module 102 that receives power from a power distribution subsystem 104 and receives outside air cooling from a cooling system 106. IT module 102 includes IT gear 105 that has temperature limitations, and in particular a specified minimum temperature limit. For example, components with moving parts can seize at low temperatures. Contraction of metallic components due to cold temperatures can also cause damage. IT module 102 also includes IT gear 107 that is moisture sensitive. Electrical components can short or degrade due to moisture intrusion. Generally-known cooling systems are directed to cooling IT modules below a maximum temperature limit. Cooling system 106 according to aspects of the present disclosure also prevents MDC 100 from operating below a minimum temperature limit of IT gear 105 to ensure performance and/or reliability. Cooling system 106 according to aspects of the present disclosure also prevents MDC 100 from operating above a maximum humidity value that could cause damage to IT gear 107.

MDC 100 can be deployed to a location that is subject to cold winter weather that can be below the minimum temperature limit. The insulative properties of IT module 102 can allow heat to escape from MDC 100, increasing a required amount of heat to be generated within MDC 100 to reach the minimum temperature limit. Generally, most of the heat generated within MDC 100 is caused by electrical power consumed within IT module 102 to process compute work load. The waste heat generated is referred to herein as compute heat load. The overall amount of work performed by the cooling system in transferring heat from all sources is the cooling heat load, or merely cooling load. The cooling load includes heat from the ambient environment, compute heat load, and heat generated by ancillary systems such as any supplemental or synthetic heating.

According to one aspect, the amount of compute workload being handled within IT module 102 can generate insufficient compute heat for IT module 102 to reach the minimum temperature limit. The compute workload can similarly be too low to lower the relative humidity by increasing the air temperature, creating a risk of condensation. When recirculated IT return air is not warm enough for a minimum temperature limit of IT module 102 or is not warm enough to avoid condensation, air handling unit (AHU) controller 108 dynamically controls supplemental heater 110 to supplement the compute heat that is available in cooling system 106.

IT module 102 contains one or more rack-based IHSs 113. Within the general context of IHSs, IHS 113 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communication between the various hardware components.

In at least one embodiment, MDC 100 is and/or is configured as an Expandable Modular Information Technology Building Infrastructure (EMITBI). Further, because of the relatively large scale of MDC 100 and the use of modular building blocks that house the IHS 113 within the MDC 100, the combination of IT modules 102 are collectively referred to herein as a modularly-constructed, large-scale information handling system (LIHS).

IT module 102 contains one or more rack-based IHSs 113 that are positioned between cold aisle 114 and hot aisle 116 with respect to a flow of cooling air that is directed by AHU 112 utilizing actuators such as intake damper 118, exhaust damper 120 and recirculation damper 122. Air mover 124 creates the flow of cooling air through AHU 112. AHU controller 108 selects cooling air to be obtained solely from outside air 126 by opening intake and exhaust dampers 118, 120 and closing recirculation damper 122. AHU controller 108 selects an air handling mode for cooling air to be solely recirculated IT return air from return 128 by closing intake and exhaust dampers 118, 120 and opening recirculation damper 122. AHU controller 108 selects a mix of outside and recirculated IT return air in an air intake 129 by partially opening intake, exhaust and recirculation dampers 118, 120, 122.

AHU controller 108 receives inputs from: (i) outside air temperature transducer 130; (ii) outside relative humidity transducer 132; (iii) cold aisle temperature transducer 134; (iv) cold aisle relative humidity transducer 136; (v) return temperature transducer 138; and (vi) return relative humidity transducer 140. A total amount of power consumed by rack-based IHSs 113 can be sensed by power meter 142 coupled to power distribution subsystem 104. Supplemental power consumed by supplemental heater 110 can be part of the power value detected by power meter 142. Processor subsystem 144 of AHU controller 108 executes AHU utility 146 contained in memory 148 to determine control settings for AHU 112 based on power, temperature and relative humidity inputs. In one or more embodiments, use of outside cooling air is a most economical mode of operation for AHU 112. A two-dimensional mapping is made of outside air temperature versus outside relative humidity. Region(s) within the mapping are designated for open mode with only outside air for cooling when the temperature and relative humidity ranges are appropriate for cooling IT module 102. Other region(s) of the mapping are suitable with other modes, such as using partially mechanically cooled ("mechanical trimming mode" or "multi-mode) or wholly mechanically cooled air ("closed mode") based on internal temperature and relative humidity values. Other region(s) can be appropriate for mixed mode with some IT return air recirculated along with outside air. According to the present innovation, AHU controller 108 determines that outside air is unsuitable to use solely for cooling air as being too cold and/or too humid. AHU controller 108 also determines that mixed mode using recirculated IT return air is also not adequate to warm the cooling air sufficiently. Thus, AHU controller 108 activates and modulates a supplemental heating in a closed mode in order to achieve one or both of sufficiently warm cooling air and sufficiently dry cooling air.

Figure 2:
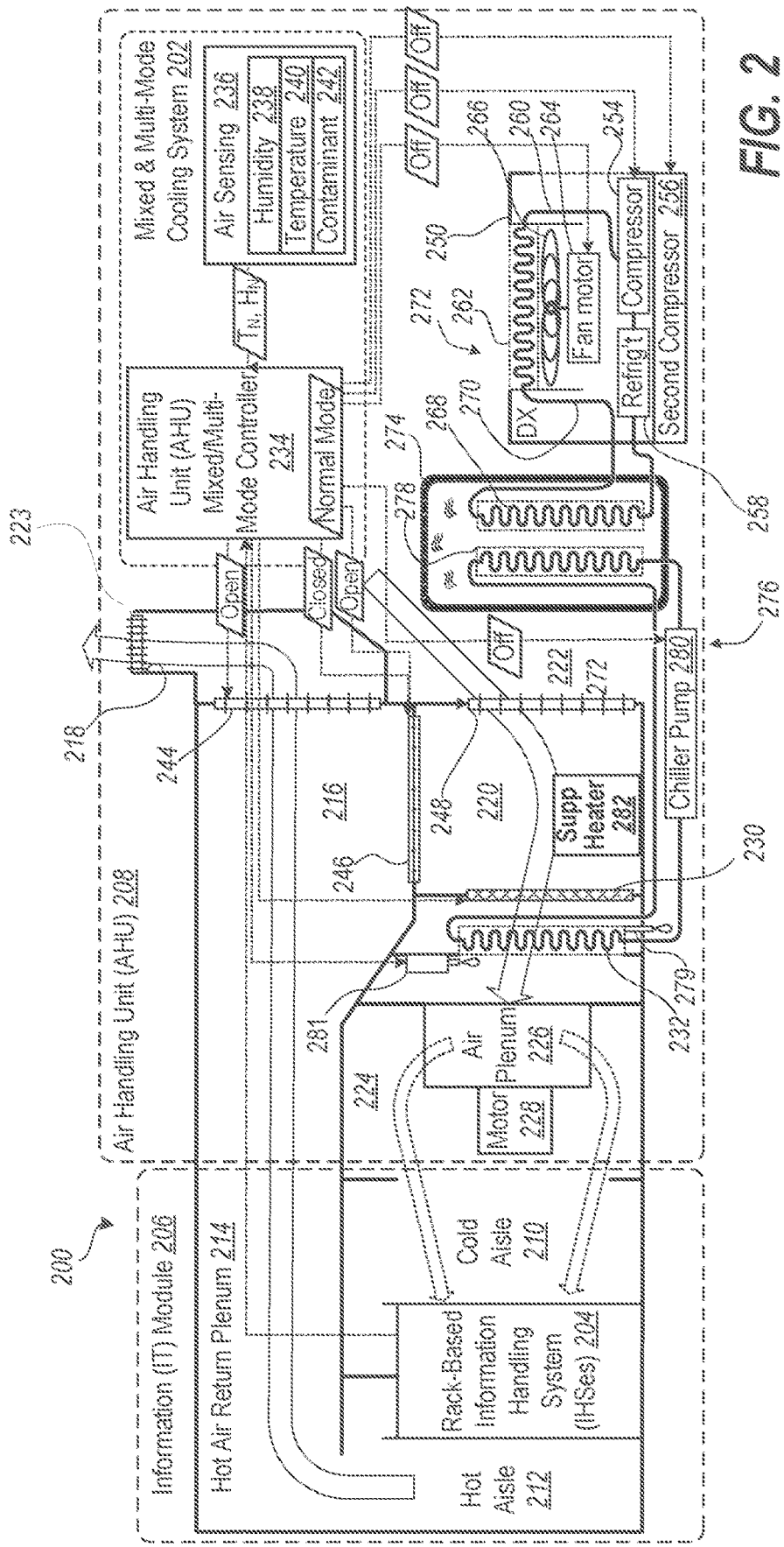
FIG. 2 is a block diagram illustrating functional components within an example data center having a cooling system that uses supplemental heating, according to one or more embodiments.
Figure 3:
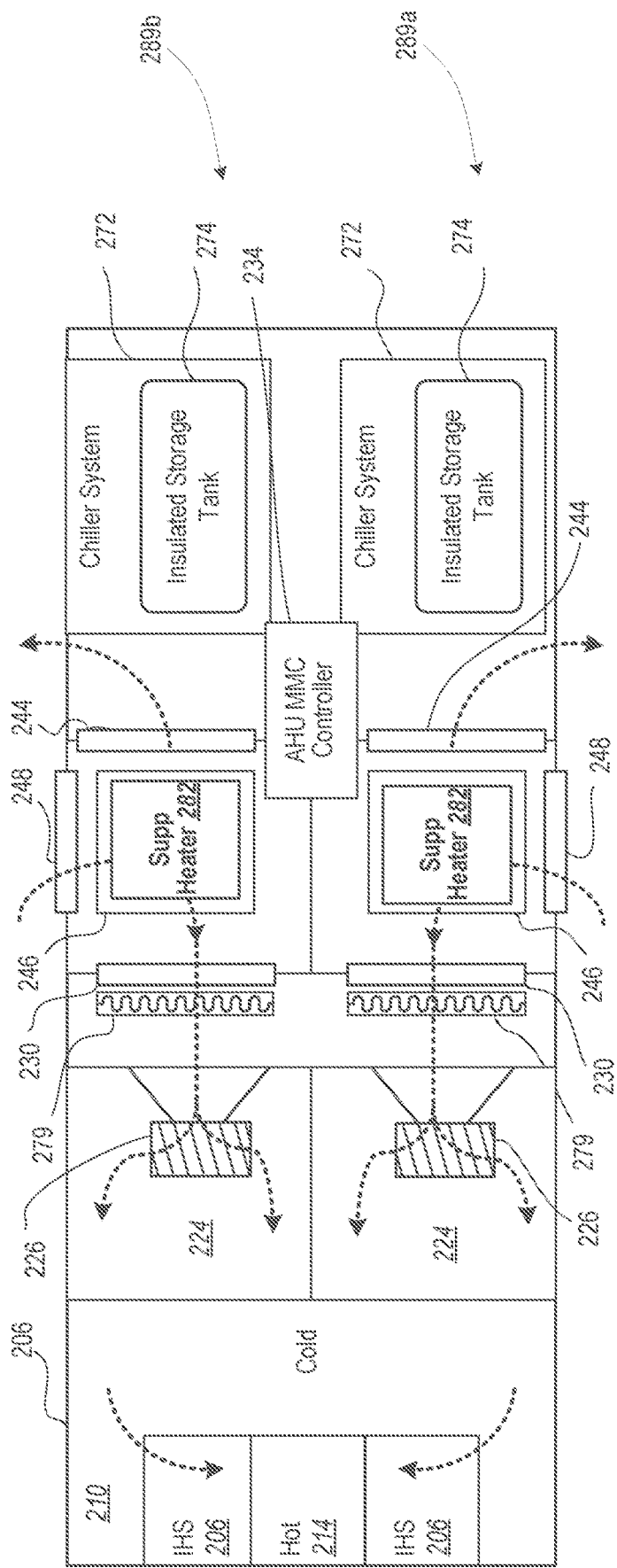
FIG. 3 is a block diagram illustrating the example data center having the cooling system with paired air handling units (AHUs) that include supplemental heaters, according to one or more embodiments.

FIGS. 2-3 are block diagrams illustrating an example data center 200 having a mixed and multi-mode cooling (MMC) system 202 that can reduce energy costs by expanding use of outside air for cooling. Aspects of the present innovation can have application to cooling systems that include direct expansion (DX) cooling as well as outside air cooling. The term mixed mode refers to using recirculated air (e.g., IT return air within hot aisle 212 of IT blocks/modules 206) to warm outside air that is otherwise too cold (or too humid). Multi-mode refers to performing mechanical cooling while using outside cooling air, via a process referred to herein as mechanical trimming. The expanded use of outside air includes partial use of outside air even when the outside temperature and the outside humidity are not within an acceptable range for IHSs 204 within an IT module 206 of data center 200. In one embodiment, the MMC system 202 directly controls an air handling unit (AHU) 208 that provides cooling to at least one IT module within modular data center 200.

Data center 200 of FIG. 2 includes an IT module 206 having a row of rack-mounted IHSs 204 that separate a cold aisle 210 from a hot aisle 212. Cold aisle 210 is the cooling air intake aisle that receives IT supply air. Hot aisle 212 is the cooling air return aisle that receives IT return air that has passed over and/or through the rack-mounted IHSs 204. Hot aisle 212 is in fluid communication with a hot air return plenum 214. The AHU 208 includes a return chamber 216 that is in fluid communication with the hot air return plenum 214. The AHU 208 includes an exhaust portal, such as, but not limited to, an exhaust chimney 218, which is in in fluid communication with the return chamber 216. The AHU 208 includes an intake chamber 220 that is in fluid communication with the return chamber 216 and an outside environment 222. In one embodiment, the exhaust chimney 218 mitigates warmed air being drawn into the intake chamber 220. However, an exhaust portal 223 can be flush mounted, relying on spacing to prevent inadvertent recirculation. It is appreciated that the outside environment encompasses some or all of the exterior of the AHU 208 and data center 200, and the specific location illustrated within FIG. 2 only references one location adjacent/relative to the intake chamber 220 for simplicity. The AHU 208 includes an air mover to move air through the IT module 206. Specifically, the AHU 208 includes an outlet chamber 224 that is uniformly pressurized by an air plenum blower 226 driven by a motor 228. The air plenum blower 226 pulls air in axially and sprays it out radially within an enclosed space to pressurize outlet chamber 224 evenly. The air plenum blower 226 draws air from the intake chamber 220 through a contaminant filter 230 and a chiller coil 232. The pressurized air in the outlet chamber 224 exits the AHU 208 and enters the cold aisle 210 of the IT module 206.

The AHU 208 can be configured for a mode of cooling that is appropriate for the outside ambient conditions. In one or more embodiments, the AHU 208 can be configured by the MMC system 202 for one of (1) a normal or open mode, (2) a mixed mode, (3) a multi-mode, and (4) a closed mode. Open mode as used herein refers to solely using outside air cooling without recirculation. Open mode includes using outside air for cooling due to failure of mechanical cooling. Open mode includes normal mode when outside air for cooling is used for economy when mechanical cooling is operational but not used. Mixed mode refers to recirculating a portion of IT return air to warm cooling air such that the resulting IT supply air is above a minimum dry bulb temperature or reduces a relative humidity. Multi-mode uses mechanical trimming where some of the cooling air passes through a mechanical cooling subsystem and is combined with outside air. Closed mode recirculates all IT return air and generally uses only mechanical cooling to remove heat from AHU 208. Open mode expels all IT return air. Mixed mode expels some of the IT return air. Closed mode can also be used with supplemental heating instead of mechanical cooling when the temperature of the cooling air is less than a minimum temperature threshold and/or the humidity value of the cooling air is greater than a humidity threshold.

FIG. 2 illustrates the AHU 208 having an AHU MMC controller 234 that is responsive to air sensing components 236. Air sensing components 236 can include, but are not limited to, a humidity sensor 238, a temperature sensor 240, and a gas/liquid/solid contaminant sensor 242. When the air sensing components 236 indicate that the ambient temperature of the exterior air is within an acceptable (or normal) range ($T_N$) and that the humidity of the exterior air is also within an acceptable range ($H_N$), the AHU MMC controller 234 configures the AHU 208 for normal mode cooling, which involves using only the outside air for cooling of the IHSs. An exhaust damper 244 is opened between the return chamber 216 and the exhaust chimney 218 to allow the exhaust air to exit the AHU 208. Simultaneously or concurrently, a recirculation damper 246 is closed between the return chamber 216 and the intake chamber 220 to prevent recirculation of the exhaust air. An outside air intake damper 248 is opened, allowing outside air from the outside environment 222 to enter the AHU 208. In normal mode, DX cooling unit 250 that supports the AHU 208 remains off.

FIG. 2 also illustrates DX cooling unit 250, having a first compressor 254 and a second compressor 256 for stepped performance. The compressors 254, 256 compress and move compressed (liquid) refrigerant on a high side from a refrigerant tank 258 through a discharge line 260 and through a condenser coil 262. A condenser fan motor 264 drives a condenser fan 266 to move condensing air through the condenser coil 262. The condensing air convectively removes heat (generated during the compression) from the refrigerant. An expansion device (not shown) downstream of the condenser coil 262 causes expansion cooling by creating a pressure loss between the high and low sides of the DX cooling unit 250. An evaporator coil 268 transfers heat from its ambient environment to the refrigerant that is then pulled from a suction line 270 back to the refrigerant tank 258. In one embodiment, MMC system 202 includes chiller system 272 that improves efficiency of DX cooling system 250 by avoiding short cycling of the compressor 254. The DX cooling unit 250 chills water in an insulated storage tank 274 that is cooled by the evaporator coil 268. The chiller system 272 includes a heat exchanger 276, which includes the chiller coil 232 and a heat sink coil 278 in the insulated storage tank 274. The AHU MMC controller 234 activates a chiller pump 280 to move water through the chiller coil 232 and a heat sink coil 278. The compressor 254 can operate for a period of time that is efficient with the insulated storage tank 274 supplying an amount of cooling as needed by pumping a determined flow rate. During start-up of DX cooling system 250, compressor 254, as an electrical motor, has to overcome high inertial loads, resulting in a short-term high current spike. Operating in this startup manner, compressor 254 consumes a far higher amount of power for a short period than once the compressor 254 is at steady state speed. To increase overall efficiency of DX cooling system 250, the compressor 254 is operated for a length that is substantially longer than the startup time so that the average power consumed per cooling load achieved is efficient. However, maintaining cooling air at a consistent temperature, or within a specified range, is also an objective. Buffering the cooling load performed by DX cooling system with chiller system 272 satisfies both objectives. Coolant such as water in chiller system 272 can absorb a large amount of thermal energy.

The DX cooling unit 250 can serve as a dehumidifier that removes moisture via a drain 279 as condensate at the chiller coil 232. Thereby, an outside humidity value that is above the acceptable range, or would become too high during multi-mode operation using mechanical trimming, can be reduced. In addition, in one embodiment, the MMC cooling system 202 can include a humidifier 281 that increases the level of humidity in the moderated outside air by adding moisture.

According to one aspect of the disclosure, AHU MMC controller 134 can supplement heat with supplemental heaters 282 in order to provide a minimum temperature required by rack-based IHSs 104 and/or to decrease relative humidity in the cooling air. In one or more embodiments, supplemental heater 282 can be the only source of heat available to AHU MMC controller 134 in order to operate at or above a minimum temperature threshold. Outside air temperature can be too cold to use. Similarly, MMC controller 134 may have no other mechanism to reduce relative humidity to below a threshold that risks condensation. IT return air can be too cold and outside air can be too humid. In one or more embodiments, MMC controller 134 can control mechanical cooling such as evaporative or DX cooling that can reduce relative humidity; however, energy consumed by supplemental heaters 282 can be less than energy consumed by activating DX cooling capabilities or that can be necessary to achieve a minimum temperature.

For clarity, FIG. 2 illustrates one side of AHU 208 having one air flow path. FIG. 3 is a top view illustrating AHU 208, bifurcated between left and right AHU subsystems 289a-289b, enabling redundancy for stepped performance. AHU MMC controller 234 controls both left and right AHU subsystems 289a, 289b.

Figure 4:
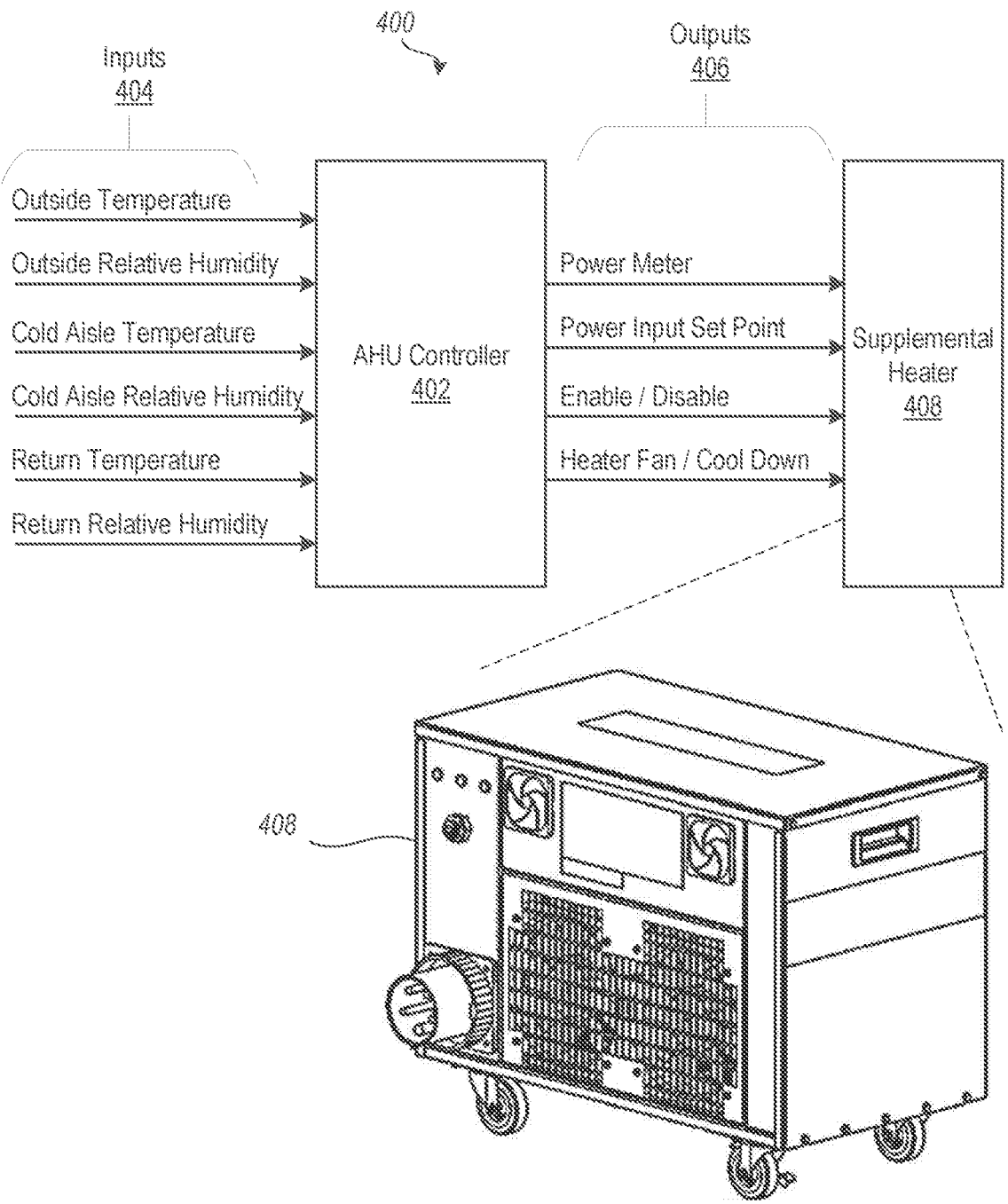
FIG. 4 is a control diagram illustrating a dynamic control flow of an AHU controller that remotely controls a supplemental heater, according to one or more embodiments.

FIG. 4 is a control diagram illustrating a dynamic control flow 400 of an AHU controller 402 receiving inputs 404 that are processed to produce control outputs 406 that remotely control a supplemental heater 408. Inputs 404 include: (i) outside temperature; (ii) outside relative humidity; (iii) cold aisle temperature; (iv) cold aisle relative humidity; (v) return temperature; and (vi) return relative humidity. AHU controller 402 transmits outputs 406 including: (i) a power meter reading; (ii) a power input set point value; (iii) an enable/disable command; and (iv) a heater fan/cool down control command or signal. Power meter reading indicates an amount of power being delivered by a power distribution system. Power input set point communicates a minimum amount of power that should delivered by the power distribution system to satisfy an air characteristic criterion. The enable/disable command or signal triggers or discontinues heat generation by supplemental heater 408. The heater fan/cool down control or signal is activated when supplemental heater 408 is activated. The heater fan/cool down control or signal also remains activated for a period of time after an active supplemental heater is disabled.

Figure 5:
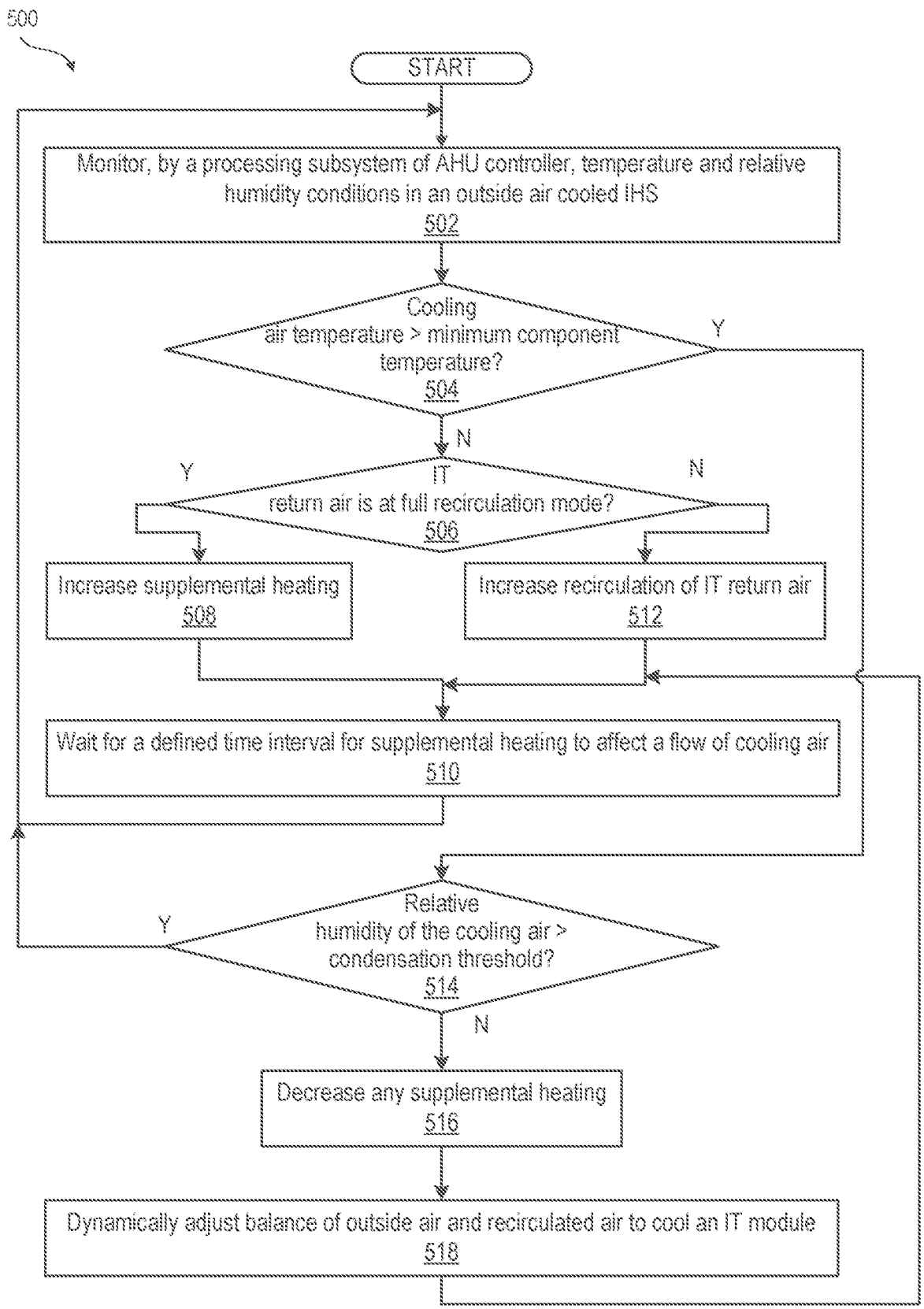
FIG. 5 is a flow chart illustrating method of using supplemental heaters within an outside air cooled IHS, according to one or more embodiments.

FIG. 5 is a flow chart of method 500 of supplementing heat within an outside air cooled IHS. Method 500 begins with monitoring, by a processing subsystem 144 of AHU controller 108 (FIG. 1), temperature and relative humidity conditions in an outside air cooled IHS (block 502). Method 500 includes determining whether cooling air temperature is above a minimum component temperature (decision block 504). In response to determining that the cooling air temperature is not above the minimum component temperature, a determination is made as to whether IT return air is at full recirculation mode (decision block 506). In response to determining that IT return air is at full recirculation mode, method 500 includes increasing supplemental heating (block 508). Method 500 includes waiting for a defined time interval for supplemental heating to affect a flow of cooling air (block 510). Then, method 500 returns to block 502 to update sensed value and to continue dynamic control of supplemental heating. In response to determining that IT return air is not at full recirculation mode in decision block 506, method 500 includes increasing recirculation of IT return air (block 512). Then method 500 proceeds to block 510 to wait and to continue monitoring requirements for supplemental heating.

In response to determining that the cooling air temperature is above the minimum component temperature in decision block 504, method 500 includes determining whether the relative humidity of the cooling air is above a condensation threshold (decision block 514). In response to determining that the relative humidity of the cooling air is above a condensation threshold, method 500 returns to decision block 506 to evaluate whether additional recirculation or supplemental heating is required to reduce the relative humidity. In response to determining that the relative humidity of the cooling air is not above a condensation threshold, method 500 includes reducing any supplemental heating (block 516). Method 500 includes dynamically adjusting the balance of outside air and recirculated air to cool the IT module 102 (FIG. 1) (block 518). Then method 500 returns to block 510 to wait for the incremental changes to have a measurable effect and then to proceed to block 502 to update measured value and to continue dynamic control based on the updated temperature and humidity feedback.

Figure 6:
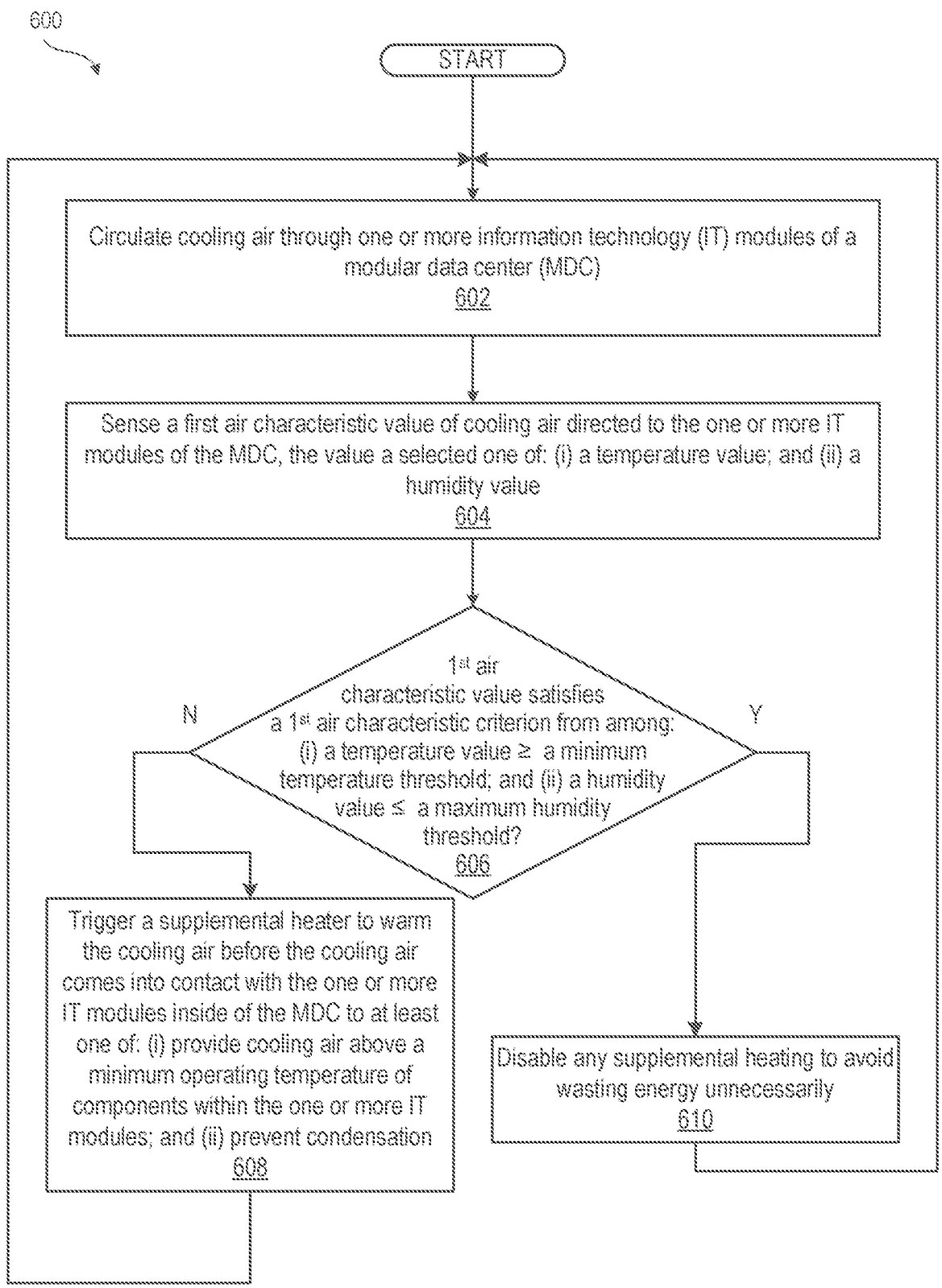
FIG. 6 is a flow diagram illustrating a method of dynamically controlling supplemental heating to compensate for compute workloads of a MDC that warm IT return air are insufficient to satisfy an air characteristic criterion, according to one or more embodiments.

FIG. 6 is a flow chart illustrating a method 600 of dynamically controlling supplemental heating to compensate for compute workloads that warm IT return air are insufficient to satisfy an air characteristic criterion. Method 600 includes circulating cooling air through IT modules of a MDC (block 602). Method 600 includes sensing a first air characteristic value of cooling air directed to the one or more IT modules of the MDC, the value being a selected one of: (i) a temperature value; and (ii) a humidity value (block 604). Method 600 includes determining whether the first air characteristic value satisfies a first air characteristic criterion from among: (i) a temperature value being equal to or greater than a minimum temperature threshold; and (ii) a humidity value being equal to or less than a maximum humidity threshold (decision block 606). In response to determining that the first air characteristic criterion is not satisfied, method 600 includes triggering a supplemental heater to warm the cooling air before the cooling air comes into contact with the one or more IT modules inside of the MDC. Supplemental heating is added to at least one of: (i) provide cooling air above a minimum operating temperature of components within the one or more IT modules; and (ii) prevent condensation (block 608). Then method 600 returns to block 604 to continue monitoring the air cooling system. In response to determining that the first air characteristic criterion is satisfied in decision block 606, method 600 includes disabling any supplemental heating to avoid wasting energy unnecessarily (block 610). Then method 600 returns to block 604 to continue monitoring the air cooling system for a need for additional supplemental heating.

In one or more embodiments, sensing the first air characteristic value comprises sensing the temperature value of the cooling air directed to the one or more IT modules of the MDC. Determining whether the first air characteristic value satisfies the first air characteristic criterion comprises determining whether the temperature value is equal to or greater than the minimum temperature threshold.

In one or more embodiments, sensing the first air characteristic value comprises sensing the humidity value of the cooling air directed to the one or more IT modules of the MDC. Determining whether the first air characteristic value satisfies the first air characteristic criterion comprises determining whether the temperature value is equal to or greater than the maximum humidity threshold.

In one or more particular embodiments, method 600 includes sensing a second air characteristic value of the humidity value of the cooling air directed to the one or more IT modules of the MDC. The first air characteristic value comprises the temperature value. Method 600 includes determining whether the second air characteristic value satisfies a second air characteristic criterion of a temperature value being equal to or greater than the minimum temperature threshold. In response to determining that the second air characteristic criteria is not satisfied, method 600 includes triggering the supplemental heater to warm the cooling air before the cooling air comes into contact with the one or more IT modules inside of the MDC to provide cooling air above the minimum operating temperature of components within the one or more IT modules.

In one or more embodiments, method 600 includes recirculating the cooling air warmed by the one or more IT modules within the MDC. Method 600 includes sensing the first and second air characteristic values of the recirculated cooling air. Method 600 includes determining a minimum IT electrical load value of heat generating components of the one or more IT modules that is required to satisfy the first and second air characteristic criteria. Method 600 includes receiving a current IT electrical load value provided by the operation of the heat generating components of the one or more IT modules within the MDC. Method 600 includes setting a heater output level based on a difference between the minimum electrical IT load value and the current IT electrical load value to satisfy both the first and second air characteristic criteria.

In one or more embodiments, method 600 includes measuring an electrical load supplied by a power distribution system to the one or more IT modules and the supplemental heater. Method 600 includes automatically adjusting the heater output level based on the difference between the minimum IT electrical load value and the electrical load supplied by the power distribution system.

In the above described flow charts of FIGS. 5-6, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A cooling system for a modular data center (MDC), the cooling system comprising:
   an air handling unit (AHU) that circulates cooling air through one or more information technology (IT) modules of the MDC;
   at least one first air characteristic transducer positioned to sense a first air characteristic value of cooling air directed to the one or more IT modules of the MDC, the value being a selected one of: (i) a temperature value; and (ii) a humidity value of cooling air;

at least one second air characteristic transducer positioned to sense a second air characteristic value of the cooling air, the second air characteristic value being a next one of (i) the temperature value and (ii) the humidity value that is not the first air characteristic value, the temperature value of the cooling air directed to the one or more IT modules of the MDC;

a supplemental heater positioned to transfer supplemental heat to the cooling air before the cooling air reaches the one or more IT modules of the MDC; and an AHU controller in communication with the at least one first air characteristic transducer and the supplemental heater, and which executes an AHU utility to enable the cooling system to:

determine whether either of the first or the second air characteristic value satisfies a respective first or second air characteristic criterion of a respective one of: (i) a temperature value equal to or greater than a minimum temperature threshold; and (ii) a humidity value equal to or less than a maximum humidity threshold; and in response to determining that either of the first or the second air characteristic criterion is not satisfied, trigger the supplemental heater to warm the cooling air before the cooling air comes into contact with the one or more IT modules inside of the MDC to (i) provide cooling air above a minimum operating temperature and below the maximum humidity threshold of components within the one or more IT modules and (ii) prevent condensation.

2. The cooling system of claim 1, wherein:
the at least one first air characteristic value comprises the temperature value of the cooling air directed to the one or more IT modules of the MDC; and
the AHU controller executes the AHU utility to enable the cooling system to:
determine whether the first air characteristic value satisfies the first air characteristic criterion of the temperature value being equal to or greater than the minimum temperature threshold; and
in response to determining that the first air characteristic criterion is not satisfied, trigger the supplemental heater to warm the cooling air before the cooling air comes into contact with the one or more IT modules inside of the MDC to provide cooling air above the minimum operating temperature of components within the one or more IT modules.

3. The cooling system of claim 1, wherein:
the at least one first air characteristic value comprises the humidity value of the cooling air directed to the one or more IT modules of the MDC; and
the AHU controller executes the AHU utility to enable the cooling system to:
determine whether the first air characteristic value satisfies the first air characteristic criterion of the humidity value being equal to or less than the maximum humidity threshold; and
in response to determining that the first air characteristic criterion is not satisfied, trigger the supplemental heater to warm the cooling air before the cooling air comes into contact with the one or more IT modules inside of the MDC to provide cooling air below the maximum humidity threshold to prevent condensation.

4. The cooling system of claim 1, wherein:
the AHU controller enables the cooling system to:
determine a minimum IT electrical load value of heat generating components of the one or more IT modules that is required to satisfy both the first and the second air characteristic criteria;
receive a current IT electrical load value of the operation of the heat generating components of the one or more IT modules within the MDC; and
set a heater output level based on a difference between the minimum electrical IT load value and the current IT electrical load value to satisfy both the first and second air characteristic criteria.

5. The cooling system of claim 4, further comprising:
a power distribution system coupled to the one or more IT modules and the supplemental heater; and
a power level transducer that measures an electrical load supplied by the power distribution system to the one or more IT modules and the supplemental heater, wherein the AHU controller enables the cooling system to automatically adjust a heater output level based on the difference between a minimum IT electrical load value and an electrical load supplied by the power distribution system.

6. The cooling system of claim 1, wherein the supplemental heater is located within an air intake chamber of the AHU.

7. A modular data center (MDC) comprising:
one or more information technology (IT) modules; and
a cooling system comprising:
an air handling unit (AHU) that circulates cooling air through the one or more IT modules of the MDC;
at least one first air characteristic transducer positioned to sense a first air characteristic value of cooling air directed to the one or more IT modules of the MDC, the value being a selected one of: (i) a temperature value; and (ii) a humidity value of cooling air;
at least one second air characteristic transducer positioned to sense a second air characteristic value of the cooling air, the second air characteristic value being a next one of (i) the temperature value and (ii) the humidity value that is not the first air characteristic value, the temperature value of the cooling air directed to the one or more IT modules of the MDC;
a supplemental heater positioned to transfer supplemental heat to the cooling air before the cooling air reaches the one or more IT modules of the MDC; and
an AHU controller in communication with the at least one first air characteristic transducer and the supplemental heater, and which executes an AHU utility to enable the cooling system to:
determine whether either the first or the second air characteristic value satisfies a respective first or second air characteristic criterion of a respective one of: (i) a temperature value equal to or greater than a minimum temperature threshold; and (ii) a humidity value equal to or less than a maximum humidity threshold; and
in response to determining that either of the first or the second air characteristic criterion is not satisfied, trigger the supplemental heater to warm the cooling air before the cooling air comes into contact with the one or more IT modules inside of the MDC to (i) provide cooling air above a minimum operating temperature and below the maximum humidity threshold of components within the one or more IT modules and (ii) prevent condensation.

8. The MDC of claim 7, wherein:
the at least one first air characteristic value comprises the temperature value of the cooling air directed to the one or more IT modules of the MDC; and
the AHU controller executes the AHU utility to enable the cooling system to:
  determine whether the first air characteristic value satisfies the first air characteristic criterion of the temperature value being equal to or greater than the minimum temperature threshold; and
  in response to determining that the first air characteristic criterion is not satisfied, trigger the supplemental heater to warm the cooling air before the cooling air comes into contact with the one or more IT modules inside of the MDC to provide cooling air above the minimum operating temperature of components within the one or more IT modules.

9. The MDC of claim 7, wherein:
the at least one first air characteristic value comprises the humidity value of the cooling air directed to the one or more IT modules of the MDC; and
the AHU controller executes the AHU utility to enable the cooling system to:
  determine whether the first air characteristic value satisfies the first air characteristic criterion of the humidity value being above the maximum humidity threshold; and
  in response to determining that the first air characteristic criterion is not satisfied, trigger the supplemental heater to warm the cooling air before the cooling air comes into contact with the one or more IT modules inside of the MDC to provide cooling air below the maximum humidity threshold to prevent condensation.

10. The MDC of claim 7, wherein:
the AHU recirculates the cooling air warmed by the one or more IT modules within the MDC;
the at least one first air characteristic transducer and the at least one second air characteristic transducer are positioned to sense conditions within the recirculated cooling air; and
the AHU controller enables the cooling system to:
  determine a minimum IT electrical load value of heat generating components of the one or more IT modules that is required to satisfy both the first and second air characteristic criteria;
  receive a current IT electrical load value of the operation of the heat generating components of the one or more IT modules within the MDC; and
  set a heater output level based on a difference between the minimum electrical IT load value and the current IT electrical load value to satisfy both the first and second air characteristic criteria.

11. The MDC of claim 10, further comprising:
a power distribution system coupled to the one or more IT modules and the supplemental heater; and
a power level transducer that measures an electrical load supplied by the power distribution system to the one or more IT modules and the supplemental heater, wherein the AHU controller enables the cooling system to automatically adjust the heater output level based on the difference between the minimum IT electrical load value and the electrical load supplied by the power distribution system.

12. The MDC of claim 7, wherein the supplemental heater is located within an air intake chamber of the AHU.

13. A method comprising:
circulating cooling air through one or more information technology (IT) modules of a modular data center (MDC);
sensing a first and a second air characteristic value of cooling air directed to the one or more IT modules of the MDC, the value being a respective one of: (i) a temperature value; and (ii) a humidity value;
determining whether either the first or the second air characteristic value satisfies a respective first or second air characteristic criterion from among: (i) a temperature value being equal to or greater than a minimum temperature threshold; and (ii) a humidity value being equal to or less than a maximum humidity threshold; and
in response to determining that either the first or the second air characteristic criterion is not satisfied, triggering a supplemental heater to warm the cooling air before the cooling air comes into contact with the one or more IT modules inside of the MDC to (i) provide cooling air above a minimum operating temperature and below the maximum humidity threshold of components within the one or more IT modules and (ii) prevent condensation.

14. The method of claim 13, wherein:
sensing the first air characteristic value comprises sensing the temperature value of the cooling air directed to the one or more IT modules of the MDC; and
determining whether the first air characteristic value satisfies the first air characteristic criterion comprises determining whether the temperature value is equal to or greater than the minimum temperature threshold.

15. The method of claim 13, wherein:
sensing the first air characteristic value comprises sensing the humidity value of the cooling air directed to the one or more IT modules of the MDC;
determining whether the first air characteristic value satisfies the first air characteristic criterion comprises determining whether the humidity value is equal to or greater than the maximum humidity threshold.

16. The method of claim 13, further comprising:
recirculating the cooling air warmed by the one or more IT modules within the MDC;
sensing the first and second air characteristic values of the recirculated cooling air;
determining a minimum IT electrical load value of heat generating components of the one or more IT modules that is required to satisfy the first and second air characteristic criteria;
receiving a current IT electrical load value provided by the operation of the heat generating components of the one or more IT modules within the MDC; and
setting a heater output level based on a difference between the minimum electrical IT load value and the current IT electrical load value to satisfy both the first and second air characteristic criteria.

17. The method of claim 16, further comprising:
measuring an electrical load supplied by a power distribution system to the one or more IT modules and the supplemental heater; and
automatically adjusting the heater output level based on the difference between the minimum IT electrical load value and the electrical load supplied by the power distribution system.

* * * * *